United States Patent
Sano

(10) Patent No.: US 7,109,901 B2
(45) Date of Patent: Sep. 19, 2006

(54) USE OF AND GATES WITH A WRITE CONTROL CIRCUIT FOR TRIMMING A BLEEDER RESISTOR

(75) Inventor: Kazuaki Sano, Chiba (JP)

(73) Assignee: Seiko Instruments Inc., (JP)

(*) Notice: Subject to any disclaimer, the term of this patent is extended or adjusted under 35 U.S.C. 154(b) by 0 days.

(21) Appl. No.: 11/092,774

(22) Filed: Mar. 29, 2005

(65) Prior Publication Data

US 2005/0231405 A1 Oct. 20, 2005

(30) Foreign Application Priority Data

Apr. 5, 2004 (JP) ............................. 2004-110655

(51) Int. Cl.
*H03M 1/10* (2006.01)
*G06F 12/00* (2006.01)
*G06F 13/00* (2006.01)

(52) U.S. Cl. ..................... 341/121; 711/103; 711/154

(58) Field of Classification Search ................ 341/121, 341/61; 327/114, 525; 347/237; 365/185.14, 365/185.28, 230.05; 710/305; 713/322; 714/719; 711/103, 154; 307/112

See application file for complete search history.

(56) References Cited

U.S. PATENT DOCUMENTS

| | | | | |
|---|---|---|---|---|
| 4,430,617 | A * | 2/1984 | Kuhlmann | 327/114 |
| 4,649,512 | A * | 3/1987 | Nukiyama | 710/305 |
| 4,737,660 | A * | 4/1988 | Allen et al. | 307/112 |
| 4,888,772 | A * | 12/1989 | Tanigawa | 714/719 |
| 5,287,469 | A * | 2/1994 | Tsuboi | 711/103 |
| 5,432,741 | A * | 7/1995 | Devore et al. | 365/185.14 |
| 5,457,488 | A * | 10/1995 | Nakamura et al. | 347/237 |
| 5,473,574 | A * | 12/1995 | Clemen et al. | 365/230.05 |
| 5,566,343 | A * | 10/1996 | Nishiguchi | 710/106 |
| 5,864,309 | A * | 1/1999 | Hung | 341/61 |
| 6,092,227 | A * | 7/2000 | Toki et al. | 714/736 |
| 6,342,807 | B1 * | 1/2002 | Nolan et al. | 327/525 |
| 6,456,554 | B1 * | 9/2002 | Gelsomini | 365/226 |
| 6,466,480 | B1 * | 10/2002 | Pekny | 365/185.2 |
| 6,567,313 | B1 * | 5/2003 | Tanaka et al. | 365/185.28 |
| 6,609,209 | B1 * | 8/2003 | Tiwari et al. | 713/322 |
| 6,647,465 | B1 * | 11/2003 | Kametani et al. | 711/131 |
| 6,650,142 | B1 * | 11/2003 | Agrawal et al. | 326/41 |
| 6,735,139 | B1 * | 5/2004 | Tang | 365/222 |

* cited by examiner

*Primary Examiner*—Patrick Wamsley
(74) *Attorney, Agent, or Firm*—Adams & Wilks

(57) ABSTRACT

In a semiconductor integrated circuit, serially inputted trimming data are sequentially written to plural memory cells in accordance with selection signals for trimming a bleeder resistor, making it possible to dispense with a data register for storing the trimming data, thereby saving layout area.

4 Claims, 3 Drawing Sheets

USE OF AND GATES WITH A WRITE CONTROL CIRCUIT FOR TRIMMING A BLEEDER RESISTOR

BACKGROUND OF THE INVENTION

1. Field of the Invention

The present invention relates to a semiconductor integrated circuit including a bleeder resistor circuit allowing for external trimming.

2. Description of the Related Art

FIG. 3 is a block diagram of a conventional semiconductor integrated circuit including a trimmable bleeder resistor circuit. The circuit includes a write control circuit 102 having a data input terminal 97 and a clock input terminal 96 as input terminals; a memory 103 composed of plural memory cells to which data are written in response to an output from the write control circuit 102; plural trimming switches 104 composed of MOS transistors switchably turned on/off in accordance with data held in the memory 103; a switch control circuit 106 for transmitting the output from the memory 103 to the trimming switches 104 after buffering; and a bleeder resistor circuit 105 partially trimmed of f by means of the trimming switch 104. The bleeder resistor circuit 105 changes the total resistance value in accordance with the combined use of the trimming switches 104 in an on-state and those in an off-state.

The write control circuit 102 includes a shift register 99 for counting clock signals inputted from the clock input terminal 96; and a data register 100 for temporarily storing trimming data inputted from the data input terminal 97.

In writing data, trimming data to be written are inputted serially to the data input terminal 97 in synchronism with the clock signal inputted to the clock input terminal 96. Once the clock signal reaches a terminal end of the shift register 99 for counting the clock signals, a write signal is outputted to a data write control signal node 98, and trimming data stored in the data register 100 are transmitted to corresponding memory cells in the memory 103.

In reading data, the trimming data stored in the memory cells in the memory 103 are transmitted to the trimming switches 104 by way of the corresponding switch control circuit 106 to thereby turn on/off the corresponding switch.

That is, the bleeder resistor circuit 105 can be trimmed into a desired resistance value by serially inputting to the data input terminal 97 data representing the combined use of the trimming switches 104 in an on-state and those in an off-state, by which a desired resistance value is attained (see JP 2003-242799 A (p. 12, FIG. 1)).

However, with the conventional semiconductor integrated circuit including the trimmable bleeder resistor circuit, the number of flip-flop circuits in the data register 100 increases along with an increase in bit number of trimming data, resulting in a larger layout area. This disadvantageously hinders cost- and size-reduction of the semiconductor integrated circuit.

SUMMARY OF THE INVENTION

The present invention has been made in view of the above-mentioned problems. It is therefore an object of the present invention to provide a semiconductor integrated circuit that overcomes the problems of the conventional techniques and saves layout area.

In order to achieve the above-mentioned object, the present invention provides a semiconductor integrated circuit including a trimmable bleeder resistor circuit, in which serially inputted trimming data are sequentially written to plural memory cells in accordance with selection signals for trimming a bleeder resistor.

With the semiconductor integrated circuit including a trimmable bleeder resistor circuit according to the present invention, a data register for storing trimming data can be omitted, whereby a semiconductor integrated circuit can be provided, which saves layout area and lowers costs.

DETAILED DESCRIPTION OF THE PREFERRED EMBODIMENTS

Figure 1:
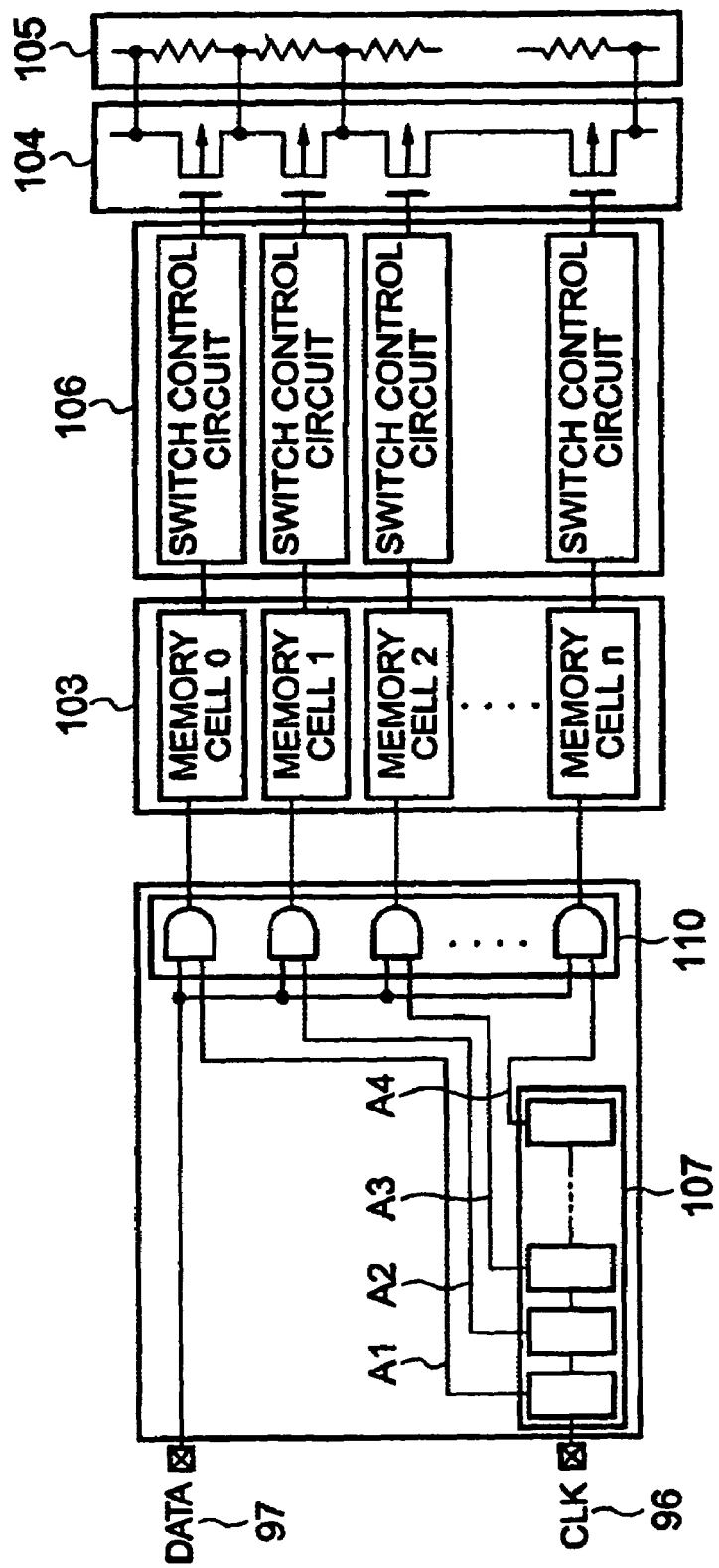
FIG. 1 is a block diagram of a semiconductor integrated circuit including a trimmable bleeder resistor circuit according to the present invention.

FIG. 1 is a block diagram of a semiconductor integrated circuit including a trimmable bleeder resistor circuit according to the present invention. The integrated circuit includes a clock input terminal 96; a data input terminal 97; a shift register 107 for generating a succession of selection signals based on a clock signal; a write control circuit 110 composed of plural AND circuits to which trimming serial data and the selection signals are inputted; a memory 103 including plural memory cells connected to the write control circuit 110; a trimming switch 104; a switch control circuit 106 that makes on/off control of the trimming switch 104 in accordance with data in the memory cells; and a bleeder resistor circuit 105 that can be partially trimmed off by means of the trimming switch.

Output signals from the shift registers 107 in each stage (A1, A2, A3, . . . , An) are successively inputted as selection signals for selecting a memory cell responsible for the data write operation from the memory 103 to the write control circuit 110 composed of AND circuits corresponding to the memory cell.

The write control circuit 110, composed of the AND circuits, outputs trimming serial data to each memory cell at timings selected in response to the selection signals. In this case, the memory cells in the memory 103 are all initialized to a low level.

Figure 2:
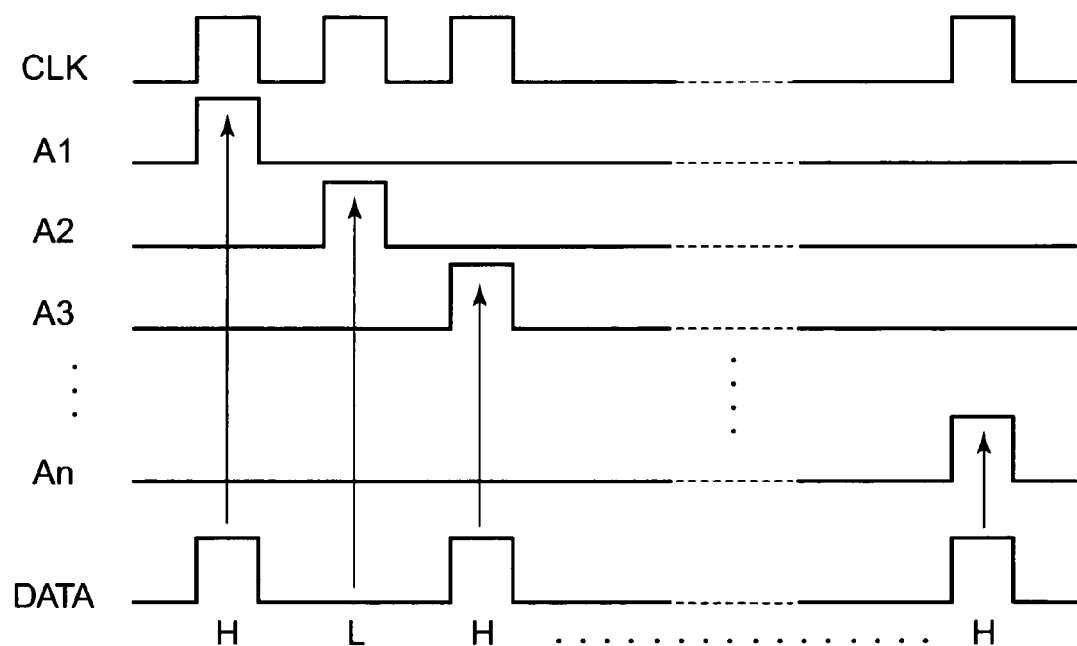
FIG. 2 shows an example of input/output waveforms of signals inputted to a write control circuit in the semiconductor integrated circuit according to the present invention.
Figure 3:
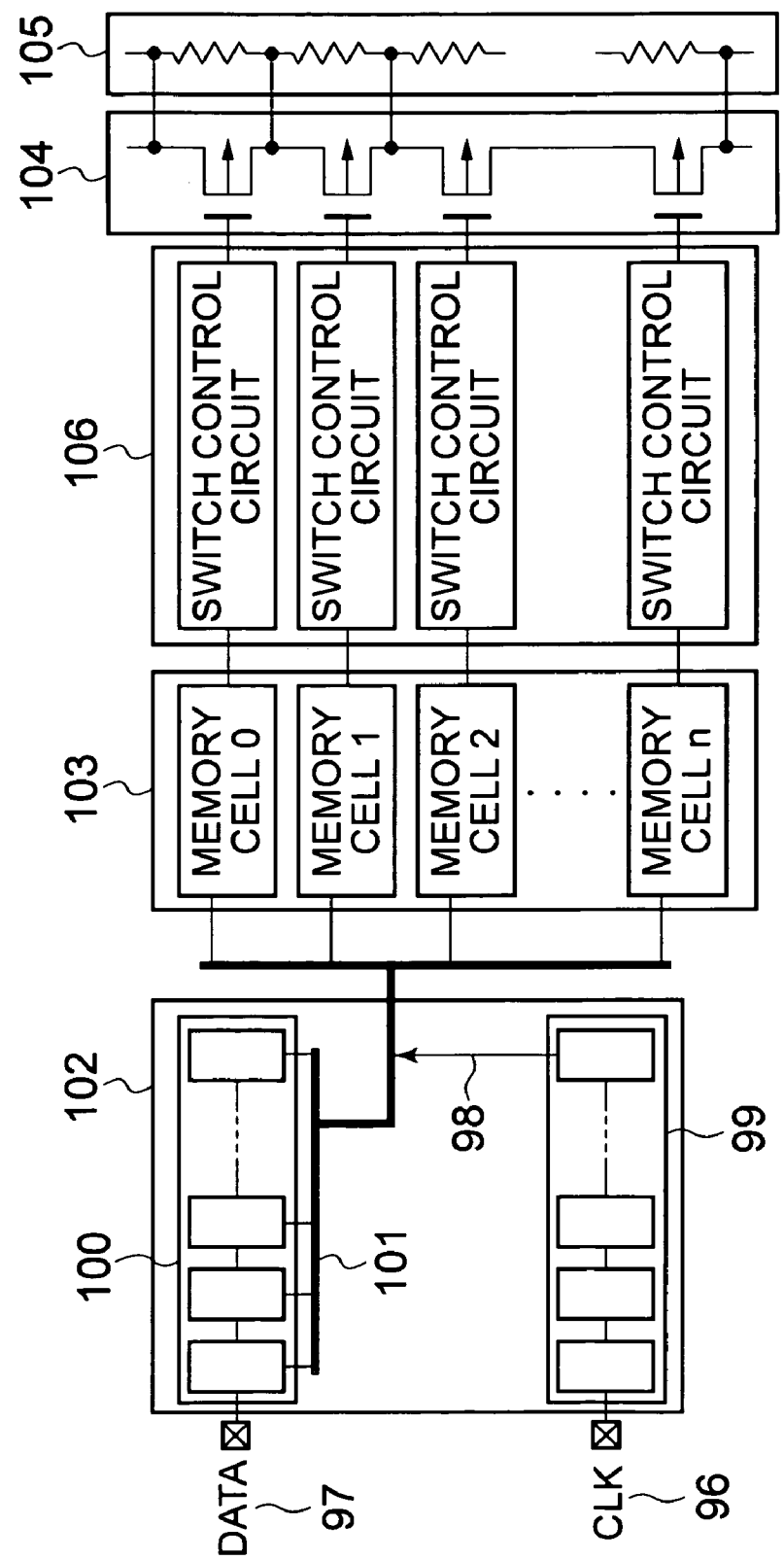
FIG. 3 is a block diagram of a conventional semiconductor integrated circuit including a trimmable bleeder resistor circuit.

FIG. 2 shows an example of the input/output waveforms of signals inputted to the write control circuit. In FIG. 2, denoted by "clk" is a time waveform of a signal inputted to the clock input terminal 96, denoted by "A1" to "An" are time waveforms of the selection signals, and denoted by "data" is a time waveform of a signal inputted to the data input terminal 97.

Inputting the clk signal to the clock input terminal 96 causes the shift register 107 to output the selection signals A1 to An. The write control circuit 110, composed of the AND circuits outputs the data signal in response to the selection signals at a high level. An output level of the write control circuit 110 becomes low when the selection signal is at the low level. Accordingly, upon writing trimming data, a signal at a high level may be inputted to the data input terminal 97 for a memory cell in the memory 103 to which the signal at the high level is to be inputted, in synchronism with a timing at which the corresponding selection signal is at a high level. In contrast, a signal at a low level may be inputted to the data input terminal 97 for a memory cell in the memory 103 to which the signal at the low level is to be inputted, in synchronism with a timing at which the corresponding selection signal is at a high level.

Next, the trimming data from the memory cells in the memory 103 cause the trimming switches 104, composed of MOS transistors to turn on/off through the switch control circuit 106, thereby trimming the bleeder resistor circuit 105 into a desired resistance value.

Note that a memory electronic switch made up of a memory MOS transistor used for a nonvolatile memory may also be adopted as the trimming switch 104 of the embodiment of the present invention. In this case, an on-resistance of the memory electronic switch is set much lower than those of resistors composing the bleeder resistor circuit 105; an off-resistance thereof is set much higher than those of resistors composing the bleeder resistor circuit 105. Consequently, it is possible to dispense with the memory cells in the memory 103, resulting in further reduction in circuit size.

The description has been made so far of the operation of the circuit according to the embodiment where the AND circuits are used for the write control circuit. However, the write control circuit is not limited to AND circuits. A NOR circuit or the like can be used instead according to a logic state of an input signal. In this case, similar effects can be produced by changing the logic state in the above description about the circuit operation.

Further, it is apparent from the above that similar effects can be achieved by using a circuit where an EPROM or EEPROM capable of storing trimming data even in a power-off state is used as the memory 103.

What is claimed is:

1. A semiconductor integrated circuit, comprising:
   a shift register for generating a selection signals based on a clock signal externally inputted;
   a write control circuit to which externally inputted trimming serial data and the selection signals are inputted;
   a memory including a plurality of memory cells connected to the write control circuit;
   a plurality of trimming switches that turn on/off in accordance with data from the memory cells; and
   a bleeder resistor that can be partially trimmed off by means of the plurality of trimming switches;
   the write control circuit sequentially writing the trimming serial data to the corresponding memory cells selected by using the selection signals to trim the bleeder resistor.

2. A semiconductor integrated circuit according to claim 1, wherein the memory comprises an EEPROM.

3. A semiconductor integrated circuit according to claim 1, wherein the memory comprises an EPROM.

4. A semiconductor integrated circuit according to claim 1, wherein the shift register generates a succession of selection signals, and the write control circuit sequentially writes the trimming serial data to the corresponding memory cells in succession in accordance with successive selection signals.

* * * * *